US006727978B2

(12) United States Patent
Nishi

(10) Patent No.: US 6,727,978 B2
(45) Date of Patent: Apr. 27, 2004

(54) PROJECTION EXPOSURE APPARATUS AND PROJECTION EXPOSURE METHOD

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 4 days.

(21) Appl. No.: 10/259,418

(22) Filed: Sep. 30, 2002

(65) Prior Publication Data

US 2003/0025893 A1 Feb. 6, 2003

Related U.S. Application Data

(63) Continuation of application No. 09/302,492, filed on Apr. 30, 1999, now abandoned, which is a continuation of application No. 09/131,855, filed on Aug. 10, 1998, now Pat. No. 5,959,721, which is a continuation of application No. 08/635,575, filed on Apr. 22, 1996, now abandoned.

(30) Foreign Application Priority Data

Jun. 19, 1995 (JP) .............................. 7-175418

(51) Int. Cl.[7] ........................ G03B 27/42; G03B 27/54; G03B 27/58
(52) U.S. Cl. .............................. 355/53; 355/67; 355/72
(58) Field of Search .................... 355/53, 67, 71; 356/399–401; 414/225, 416

(56) References Cited

U.S. PATENT DOCUMENTS

| 4,418,467 A | 12/1983 | Iwai |
| 4,461,567 A | 7/1984 | Mayer |
| 4,655,584 A | 4/1987 | Tanaka et al. |
| 4,716,299 A | 12/1987 | Tanaka et al. |
| 4,737,387 A | 4/1988 | Yen |
| 4,907,931 A | 3/1990 | Mallory et al. |
| 4,982,227 A | 1/1991 | Suzuki |
| 5,042,945 A | 8/1991 | Shibata et al. |
| 5,164,974 A | 11/1992 | Kariya et al. |
| 5,197,089 A | 3/1993 | Baker |
| 5,238,354 A | 8/1993 | Volovich |
| 5,258,823 A | 11/1993 | Akamatsu |
| 5,289,231 A | 2/1994 | Magome et al. |
| 5,301,013 A | 4/1994 | Meijer et al. |
| 5,439,764 A | 8/1995 | Alter et al. |
| 5,453,816 A | 9/1995 | Wang |
| 5,464,715 A | 11/1995 | Nishi et al. |
| 5,643,654 A | 7/1997 | Fujita et al. |
| 5,646,413 A | 7/1997 | Nishi |
| 5,809,103 A | 9/1998 | Smith et al. |
| 5,958,631 A | 9/1999 | Acousta et al. |
| 5,959,721 A | 9/1999 | Nishi |
| 6,048,655 A | 4/2000 | Nakahara |
| 6,063,208 A | 5/2000 | Williams |
| 6,103,427 A | 8/2000 | Storm |

FOREIGN PATENT DOCUMENTS

| JP | A-6-302495 | 10/1994 |
| JP | A-7-74084 | 3/1995 |

*Primary Examiner*—Henry Hung Nguyen
(74) *Attorney, Agent, or Firm*—Oliff & Berridge PLC

(57) ABSTRACT

A projection exposure apparatus for exposing a photosensitive substrate with a pattern on a circular mask by projection through a projection optical system. The apparatus includes a prealignment stage for previously correcting an error of the circular mask in its rotational direction, and a transport arm and a rotatable arm for transporting the circular mask from the prealignment stage to a mask stage. The prealignment stage includes an optical detecting system for detecting the rotational error of the circular mask from a predetermined orientation on the prealignment stage, a rotatable stage for rotating the circular mask on the prealignment stage, and a unit for controlling the rotatable stage on the basis of the rotational error so that the circular mask has the predetermined orientation. Orientational adjustment can be previously performed before importing the circular mask to the mask stage of the projection exposure apparatus.

47 Claims, 12 Drawing Sheets

PROJECTION EXPOSURE APPARATUS AND PROJECTION EXPOSURE METHOD

This is a Continuation of application Ser. No. 09/302,492 filed Apr. 30, 1999, now abandoned which in turn is a Continuation of application Ser. No. 09/131,855 filed Aug. 10, 1998 (now U.S. Pat. No. 5,959,721) which is a Continuation of application Ser. No. 08/635,575 filed Apr. 22, 1996 (now abandoned). The entire disclosure of the prior application(s) is hereby incorporated by reference herein in its entirety.

FIELD OF THE INVENTION

The present invention relates to a projection exposure apparatus for using a circular or elliptical mask on which a rectangular pattern area is formed.

DESCRIPTION OF THE RELATED ART

A projection exposure apparatus is used for transferring a circuit pattern of a semiconductor integrated circuit or a liquid crystal substrate onto a photosensitive substrate under a lithography technique. Such projection exposure apparatuses are generally classified based on their exposure systems into two known types, namely a mirror projection aligner and a reduction projection exposure apparatus called "stepper". In the mirror projection aligner, a mask and a wafer are simultaneously scanned with respect to the projection optical system interposed therebetween such that a pattern on the mask is transferred onto the wafer with equivalent magnification. FIG. 10A shows a typical example of the mask used in the mirror projection aligner. The aligner transfers an entire pattern on the mask onto the wafer by one time of scanning. Accordingly, the pattern having the same dimension as that of the wafer has been also formed on the mask. Since the wafer generally has a circular shape, exposure shot areas are designed so as to form as many semiconducter chips as possible on a wafer surface without wasting wafer area. Therefore, the mask has had the pattern as shown in FIG. 10A, and a contour of the mask has been also circular in conformity with the wafer. Such a mask has been secured to a mask stage by a vacuum chuck or the like by using portions 52A to 52D on which no pattern is formed.

On the other hand, the stepper is an apparatus for trasferring a reticle (mask) image onto a wafer by projection through a reduction projection optical system while reducing the image. In recent years, although the pattern for a circuit becomes finer and finer, it is difficult to obtain sufficient resolution for the finer pattern by the mirror projection system described above. For this reason, the reduction projection exposure system using the stepper becomes dominant. The stepper successively exposes a plurality of chips (shot areas) into which a wafer is divided. The stepper is classified to two systems, namely the step-and-repeat system in which only a wafer is step-driven with respect to a projection optical system while a reticle is fixed, and the step-and-scan system in which a reticle and a wafer are relatively scanned with respect to a projection optical system. FIG. 10B shows a plan view of a reticle used for such reduction projection exposure systems. The reticle 53 has a rectangular or square pattern section 54 which has a shape equivalent to the shape of chips formed on the wafer. In general, the pattern section 54 is covered with a pellicle for preventing a pattern from adhesion of contaminants. A pellicle frame 55 for supporting the pellicle is provided outside the pattern section 54. Attracting sections 56A to 56D for securing the reticle 53 to a reticle stage are provided at four corners outside the pellicle frame 55 so that they extend in a scanning direction for the reticle.

In any type of the projection exposure apparatuses described above, the contour of the reticle (mask) has been determined in conformity with a shape of an exposure field usable for exposure at one time. Namely, a circular mask has been used for the projection exposure apparatus of the mirror projection system, while a rectangular reticle has been used for the reduction type projection exposure apparatus of. However, as the development of fine patterns and the development of large chips are advancing in recent years, the rectangular or square shape of the reticle, which has been used in the reduction projection exposure apparatus, gives rise to an inconvenience from the viewpoint of rigidity and processing accuracy. In general, the reticle is made of a material of quartz glass from which a circular reticle would be produced easier. Therefore, it is advantageous for reticle production to produce reticles having circular contours. If the reticle has a circular shape, such a reticle is not subject to partial damage, because the flexure against external force or the like is liable to act isotropically on a plane of such a reticle. Accordingly, it is desired to use a circular reticle also in the reduction projection exposure apparatus. However, there has been hitherto no case in which any circular reticle is used in the reduction type projection exposure apparatus. Various problems must be solved upon the use of a circular reticle. For example, installation of a circular reticle to a reticle stage would require accurate positional adjustment, especially adjustment for arrangement in a rotational direction (orientation). In addition, it would be also necessary to investigate arrangement of a pattern and attracting sections in a circular reticle, installation of a pellicle, and positions for attracting the reticle on a reticle stage in conformity therewith.

SUMMARY OF THE INVENTION

An object of the present invention is to provide a novel projection exposure apparatus including a mechanism for performing positional adjustment for a circular reticle on a reticle stage efficiently and highly accurately.

Another object of the present invention is to provide a projection exposure apparatus including a prealignment stage which is capable of previously adjusting a rotational error before arranging a circular reticle on a reticle stage.

Still another object of the present invention is to provide a method which makes it possible to efficiently perform various calibration processes such as adjustment for image formation characteristics of a projection optical system, and positional adjustment for a reticle stage and a photosensitive substrate stage during exchange of a photosensitive substrate in a series of exposure operations for the photosensitive substrate by using a projection exposure apparatus of the step-and-scan system.

Still another object of the present invention is to provide a projection exposure method comprising a step which makes it possible to efficiently perform various calibration processes such as adjustment for image formation characteristics of a projection optical system, and positional adjustment for a reticle stage and a photosensitive substrate stage during exchange of a photosensitive substrate in a series of exposure operations for the photosensitive substrate by using a projection exposure apparatus of the step-and-scan system.

According to a first aspect of the present invention, there is provided a projection exposure apparatus for exposing a photosensitive substrate with a pattern formed on a circular mask having a rectangular pattern area by projection through a projection optical system, comprising:

an illumination optical system for illuminating the circular mask;

a mask stage;

a stage for moving the photosensitive substrate two-dimensionally;

a prealignment stage for pre-aligning the circular mask for its orientation, the prealignment stage comprising a detecting means for detecting an orientational error of the circular mask from a predetermined orientation on the prealignment stage, a rotatable means for rotating the circular mask on the prealignment stage, and a control means for controlling the rotatable means on the basis of the orientational error so that the circular mask has the predetermined orientation; and a transport means for transporting the circular mask from the prealignment stage to the mask stage while maintaining a pre-aligned orientation of the circular mask. The detecting means may comprise two optical sensors for detecting marks formed at least at two positions on the circular mask respectively, a moving unit for relatively moving the prealignment stage with respect to the optical sensors so that each of the marks on the circular mask relatively passes across each of optical paths of the optical sensors, and a calculating means for calculating the orientational error on the basis of a difference between detected positions of the marks detected by the two optical sensors, and the rotatable means may be composed of a rotatable stage installed on the prealignment stage.

According to the first aspect of the present invention, the two marks for positional adjustment affixed to the circular reticle (circular mask) are detected by moving the prealignment stage for the circular reticle with respect to the detecting means comprising detecting devices such as the optical sensor to determine the orientational (rotational) error $\Delta\theta$ from the predetermined orientation of the circular reticle on the basis of the difference between detected positions of the two marks. The orientation of the circular reticle can be pre-aligned by rotating the circular reticle by the error $\Delta\theta$ in a rotational direction for correction on a rotatable stage installed on a prealignment stage 11 as shown in FIGS. 3A and 3B. The rotatable stage is used separately from the reticle stage (mask stage). Accordingly, it is possible to correct a rotational error which is in an amount incapable of $\theta$-correction on the reticle stage. It is unnecessary to place the reticle on the reticle again even when the rotational error is large.

According to a second aspect of the present invention, there is provided a projection exposure apparatus for exposing a photosensitive substrate with a pattern formed on a circular mask having a rectangular pattern area and having a cutout by projection through a projection optical system, comprising:

an illumination optical system for illuminating the circular mask;

a mask stage;

a stage for moving the photosensitive substrate two-dimensionally;

a prealignment stage for pre-aligning the circular mask, the prealignment stage comprising two fastening sections for fastening the cutout of the circular mask, and a movable pin for moving the circular mask on the prealignment stage; and a transport means for transporting the pre-aligned circular mask from the prealignment stage to the mask stage.

According to the second aspect of the present invention, when the circular reticle having the cutout (orientation flat) is used, the cutout is fastened at two positions on the prealignment stage of the present invention as shown in FIG. 2. Therefore, the orientation of the circular reticle can be easily pre-aligned.

According to a third aspect of the present invention, there is provided a projection exposure apparatus for exposing a photosensitive substrate with a pattern formed on a circular mask having a rectangular pattern area and having a cutout by projection through a projection optical system, comprising:

an illumination optical system for illuminating the circular mask;

a mask stage;

a stage for moving the photosensitive substrate two-dimensionally; and a transport means for transporting the circular mask to the mask stage while maintaining a pre-aligned orientation of the circular mask.

In the third aspect, the transport means preferably comprises a transport arm having at least three pawls for grasping the circular mask for performing prealignment for the circular mask by fastening the cutout of the circular mask with two pawls of the at least three pawls, a rotatable arm having an attracting section for attracting the circular mask for transporting the circular mask to the mask stage by performing rotary movement, and a transport control unit for controlling operations of the transport arm and the rotatable arm. The circular reticle (circular mask) can be pre-aligned while transporting the circular reticle, since the cutout of the circular reticle is fastened at two positions by the pawls of the transport unit (rotatable arm) for transporting the circular reticle to the reticle stage (mask stage). Since the circular reticle is pre-aligned as described above, it is unnecessary to provide a complex mechanism for adjusting the orientation of the circular reticle on the reticle stage.

In the projection exposure apparatus of the present invention, the mask stage preferably comprises an attracting section for holding the circular mask at a position outside each side of a rectangle which defines the pattern area in the circular mask. Since the attracting section is provided at such a position, the influence of acceleration in a scanning direction is hardly exerted in an apparatus of the step-and-scan system, and the position of the reticle is not deviated during scanning. The projection exposure apparatus is preferably a reduction projection exposure apparatus.

According to a fourth aspect of the present invention, there is provided a method for performing calibration for a projection optical system included in a projection exposure apparatus used for exposing a photosensitive substrate by projection with a pattern formed on a mask having a teg mark (teg: top edge gilt, t.e.g.), comprising the steps of:

arranging a sensor at an exposure position for the photosensitive substrate;

arranging the mask at a position at which the sensor and the teg mark on the mask are in a conjugate relation through the projection optical system; and detecting an image of the teg mark formed through the projection optical system by using the sensor while relatively moving the sensor and the mask, wherein the calibration being performed after completion of an exposure operation for the photosensitive substrate and during a period in which the photosensitive substrate is exchanged by withdrawing the photosensitive substrate from an exposure field of the projection optical system.

According to a fifth aspect of the present invention, there is provided a projection exposure method of the step-and-scan system for exposing a photosensitive substrate by projection with a pattern formed on a mask having a teg mark by synchronously scanning the mask and the photosensitive substrate through a projection optical system, comprising the steps of:

exposing the photosensitive substrate by synchronously scanning the mask and the photosensitive substrate through the projection optical system while illuminating the mask;

exchanging the photosensitive substrate by withdrawing the photosensitive substrate from an exposure field of the projection optical system;

arranging a sensor at an exposure position for the photosensitive substrate, and arranging the mask at a position at which the sensor and the teg mark on the mask are in a conjugate relation through the projection optical system, during the step of exchanging the photosensitive substrate; and performing calibration for the projection optical system by detecting an image of the teg mark formed through the projection optical system by using the sensor.

According to the fourth and fifth aspects of the present invention, the teg mark affixed to the reticle (mask) can be measured by using the sensor arranged in juxtaposition with a wafer stage through the projection optical system upon exchange of the wafer in the projection exposure process. Accordingly, the calibration for, for example, image formation characteristics of the projection optical system can be performed without any decrease in throughput. The methods of the present invention are preferably applied to a projection exposure method for using a circular mask. The calibration can be performed for at least one adjustment process with respect to image formation characteristics of the projection optical system, and positional adjustment for the mask and the photosensitive substrate.

The term "mask" used herein is a concept including the reticle as well. In this specification, the term "circular reticle" is a concept including not only the circular reticle but also elliptical and regular polygonal reticles, and the term "rectangular pattern area" is a concept including square and oblong pattern areas. The term "transport means" corresponds to a "transport mechanism" in embodiments described below.

DETAILED DESCRIPTION OF PREFERRED EMBODIMENTS

Figure 1:
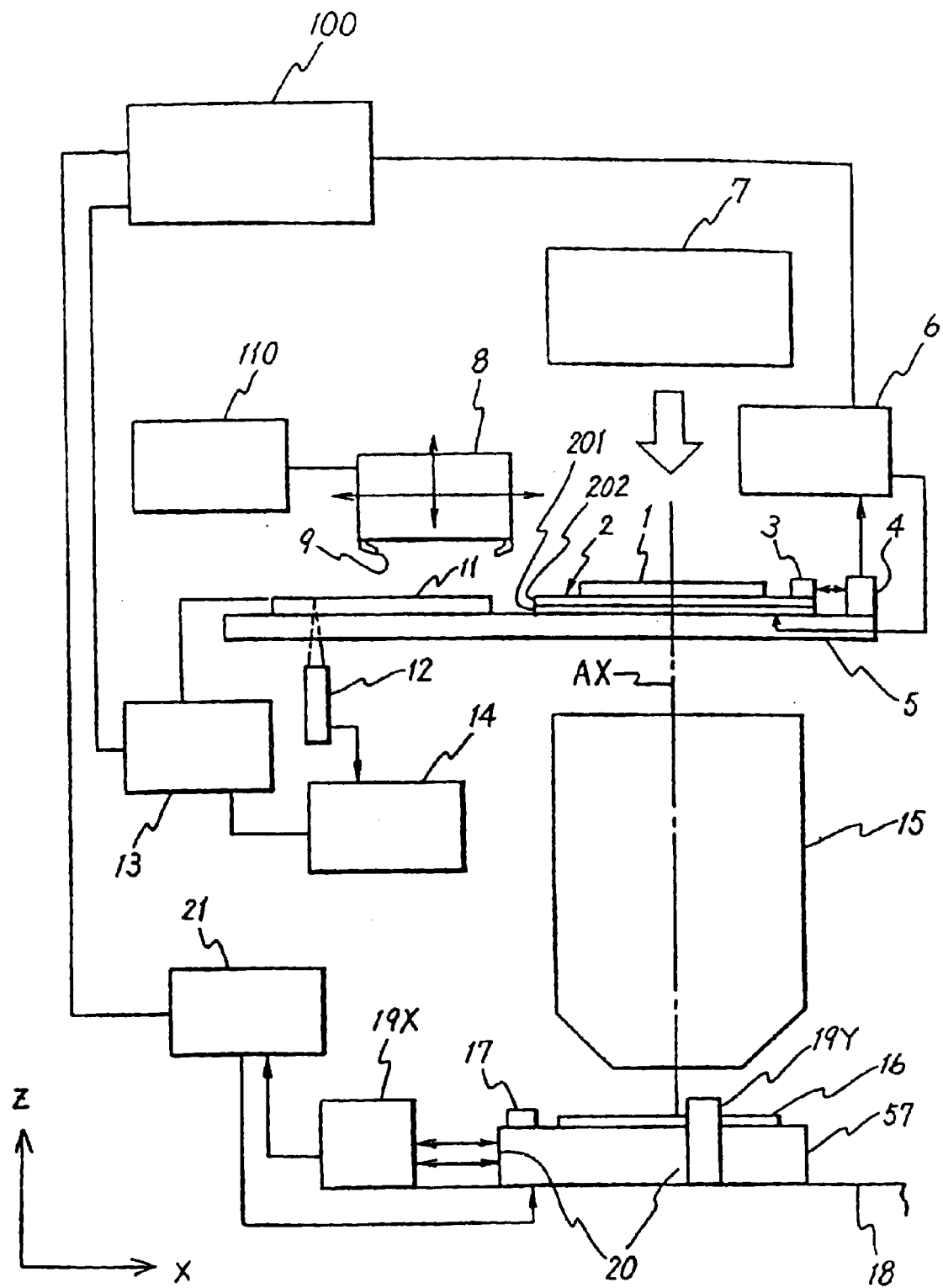
FIG. 1 is an overview of an embodiment of the projection exposure apparatus of the present invention.

One embodiment of the projection exposure apparatus of the present invention for using a circular reticle will be explained below with reference to the drawings. This embodiment explains a reduction projection type exposure apparatus which adopts the step-and-scan system. FIG. 1 shows an overview of the reduction projection type exposure apparatus of this embodiment. The reduction projection type exposure apparatus of this embodiment principally comprises an illumination optical system 7, a reticle stage 2 for moving a reticle 1, a prealignment stage 11 for adjusting the reticle 1 for its orientation (rotational direction), a transport unit 110 for transporting the orientation-adjusted reticle from the prealignment stage 11 to the reticle stage 2, a projection optical system 15 for projecting an image of a pattern formed on the reticle onto a wafer 16, a wafer stage 57, and a main control unit 100.

The illumination optical system 7 comprises a relay lens, a fly's eye lens, an integrator sensor, a speckle-reducing device, a field diaphragm, etc. An illumination light beam emitted from a light source such as an excimer laser (not shown) comes into the illumination optical system 7. The reticle 1 on the reticle stage 2 is illuminated with the illumination light beam radiated from the illumination optical system 7 with substantially uniform illuminance. The reticle stage 2 comprises a Y stage 201 placed on a support stand 5, and a stage for finely driving the reticle 202 placed on the Y stage 201. The Y stage 201 moves the reticle 1 in a direction of the Y axis (scanning direction: direction perpendicular to the plane of the paper). The stage for finely driving the reticle 202 performs highly accurate positional control for the reticle 1 by minute amounts in the X direction (direction parallel to the plane of the paper), the Y direction, and the θ direction (rotational direction) respectively. A movement mirror 3 is installed on the stage for finely driving the reticle 202. The reticle 1 is controlled for its movement by monitoring reflected light beams from the movement mirror 3 and an unillustrated fixed mirror by using an interferometer 4. This control is controlled by a reticle stage control unit 6 connected to a reticle driving mechanism (not shown).

The projection optical system 15 is a reduction optical system for projecting the pattern image on the reticle 1 onto the wafer 16 while reducing the image ⅕-fold or ¼-fold, which comprises a plurality of lens elements. If the projection lens optical system 15 has a reduction magnification of M-fold (for example, ¼-fold), the wafer 16 is scanned in a direction (for example, −Y direction) opposite to a scanning direction for the reticle 1 (for example, +Y direction) at a velocity of V×M with respect to a scanning velocity of V for the reticle 1. Thus a projection image of the entire pattern on the reticle 1 is transferred onto one area on the wafer 16. This operation is repeatedly performed for all shot areas on the wafer 16 in accordance with the step-and-scan system. Thus the all shot areas on the wafer 16 are exposed with the pattern image on the reticle 1 by projection respectively.

The wafer stage 57 principally comprises an XY stage capable of moving the wafer 16 in the XY directions, and a Z/tilt stage installed thereon (both stages are not shown) The wafer 16 is placed and fixed on the Z/tilt stage. X axis and Y axis interferometers 19X, 19Y for receiving reflected light beams from reflection planes (movement mirrors) 20 provided on side surfaces of the wafer stage 57 can be used to always monitor positions of the wafer 16 in the X and Y directions. Positional adjustment for the wafer is performed such that a wafer stage control unit 21 moves the XY stage and the Z/tilt stage on the basis of output signals from the interferometers 19X, 19Y. In this arrangement, the X axis interferometer 19X radiates two laser beams in parallel to the X axis to the wafer stage 57 so that a position in the X direction and a pitching amount (rotational amount about the Y axis) of the wafer stage 57 may be detected. The Y axis interferometer 19Y radiates three laser beams in parallel to the Y axis to the wafer stage 57, the three laser beams being not ranked on an identical straight line, so that a position in the Y direction, a rolling amount (rotational amount about the X axis), and a yawing amount (rotational amount about the Z axis (optical axis AX of the projection optical system 15)) of the wafer stage 57 may be detected.

The projection exposure apparatus of this embodiment includes a prealignment stage 11 installed on the support stand 5 separately from the mechanism for correcting θ rotation on the reticle stage 2, in order to adjust the orientation (rotational direction) of the reticle. When the reticle 1 is carried on the prealignment stage 11, an output result from a detecting optical system 12 is analyzed by a prealignment control system 14, and a rotational error is instructed to a prealignment stage control unit 13 to perform correction for rotation as described later on. After that, the pre-aligned reticle 1 is grasped by a transport arm 8, and it is transported onto the reticle stage 2 by the transport unit 110. The movement of the reticle 1 from the prealignment stage 11 to the reticle stage 2 is controlled by the transport unit 110. The control for the reticle stage control unit 6, the wafer stage control unit 21, and the prealignment stage control unit 13 is managed by the main control unit 100 so that a series of alignment and exposure operations are performed properly and consistently in the projection exposure apparatus.

The reticle stage 2 of the projection exposure apparatus of this embodiment uses the movement mirror 3 for the non-scanning direction (X direction) for the reticle stage, the movement mirror 3 having a flat plane structure in the same manner as in a reticle stage described in Japanese Patent Laid-open No. 6-302495. Therefore, if the reticle 1 is placed on the reticle stage 2 while having a large rotational error, it is impossible for the stage for finely moving the reticle 202 to correct the rotation (θ). In the case of Japanese Patent Laid-open No. 6-302495, such a large rotational error is corrected by once removing the reticle, and placing the reticle again after rotating the stage for finely moving the reticle. Since the present invention uses the circular reticle, it is necessary to provide an original rotational error-correcting mechanism for correcting the rotational error of the circular reticle. Since the reticle has a circular contour, the rotational error is apt to become large. The present invention uses the prealignment stage 11 described above, whereby the rotational error of the circular reticle can be corrected accurately, and the operation for the reticle to be placed again on the reticle stage 11 can be avoided.

Figure 2A:
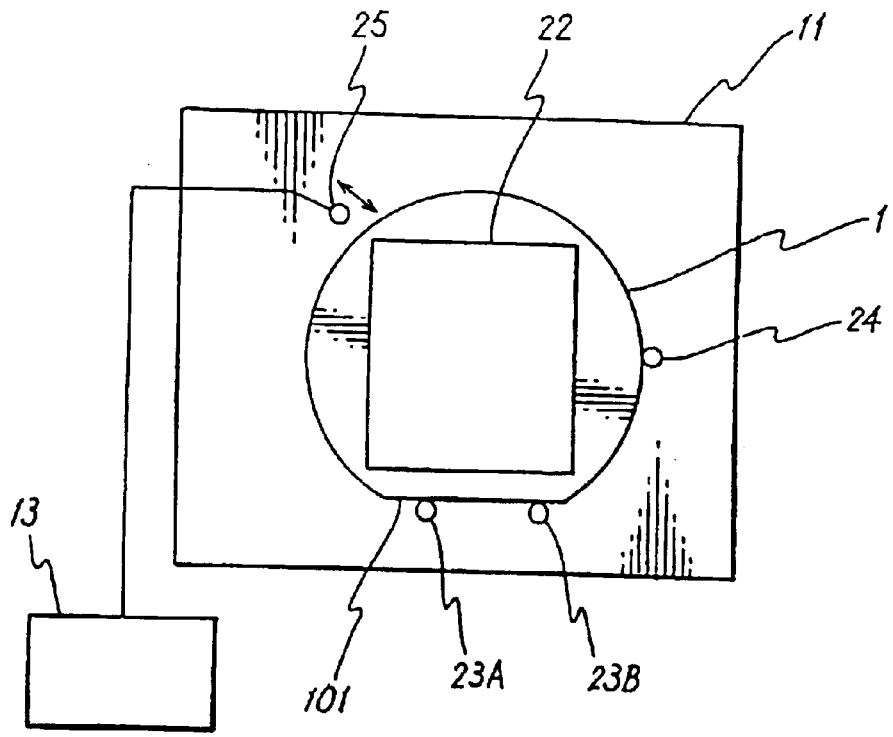
FIG. 2A is a top view of a prealignment stage for a circular reticle having a cutout to be used in the projection exposure apparatus of the present invention.

FIG. 2A shows a plan view of a prealignment stage 11 for pre-aligning a circular reticle 1 having a rectangular pattern area 22 in its inside and having one linear cutout (orientation flat) 101 at a part of its circumference. The prealignment stage 11 includes fixed pins 23A, 23B, 24 which are fixed on its surface, and a movable pin 25 which is movable within the surface of the stage 11. The fixed pins 23A, 23B fastens the cutout 101 of the circular reticle 1 respectively, and the fixed pin fastens a part of the outer periphery of the circular reticle 1. The movable pin 25 can be moved by an actuator or the like (not shown) arranged under the surface of the stage 11. This embodiment may have such an arrangement that an actuator rod which is expandable in parallel to the stage surface is secured to a lower end of the pin 25, and expansion of the actuator rod allows the movable pin 25 to move toward the center of the reticle located at a position to be subjected to alignment. The operation of the movable pin 25 is controlled by the prealignment stage control unit 13. When the reticle 1 is placed on the prealignment stage 11 having the arrangement as described above so that the cutout 101 is approximately directed to the pins 23A, 23B, then the movable pin 25 pushes the reticle 1 toward the fixed pins 23A, 23B, 24. When the cutout 101 of the reticle 1 is fastened by the fixed pin 23A, 23B, and the circumference is fastened by the fixed pin 24, then the reticle 1 cannot move beyond the fastened position. Thus positioning is achieved automatically.

Figure 2B:
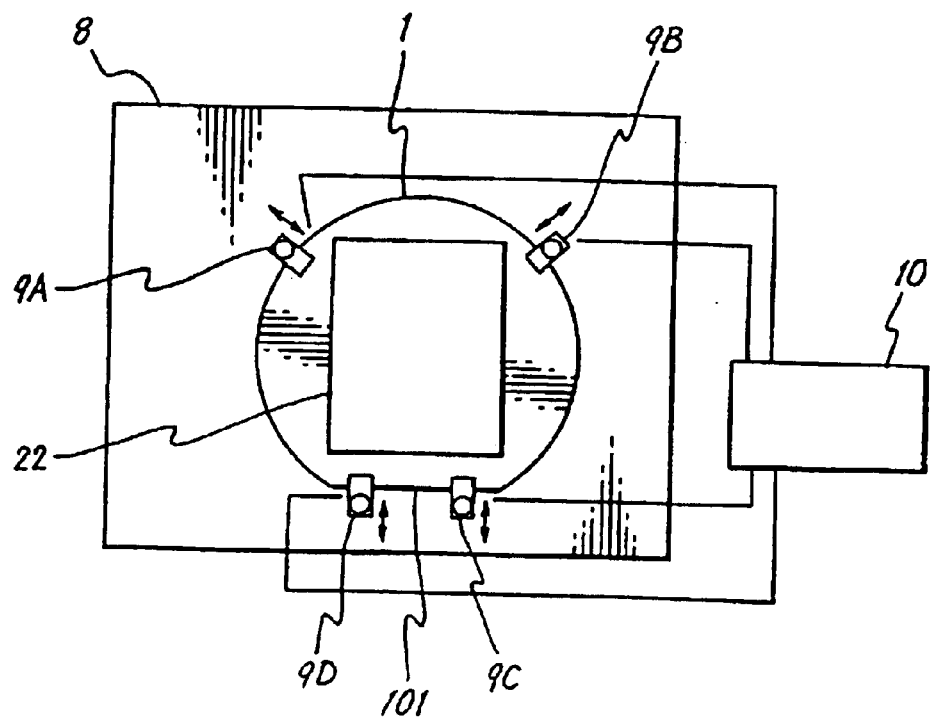
FIG. 2B is a bottom view of an arm section provided with a reticle prealignment mechanism.

Next, an example of a transport mechanism for transporting the reticle 1 having the cutout 101 at its circumference as described above to the reticle stage 2 will be explained with reference to FIG. 1, FIG. 2B, and FIGS. 11A and 11B. The transport mechanism comprises a transport arm 8 for grasping the reticle 1 in its pre-aligned state, a rotatable arm 59, and a transport control unit 110 for controlling their operations. FIG. 2B shows a bottom view of the transport arm 8. The transport arm 8 includes movable pawls 9A, 9B, 9C, 9D which are movable in directions of arrows shown in FIG. 2B on a lower surface of the transport arm 8 respectively, and their movement is controlled by a movable pawl control unit 10. As shown in FIG. 1, the movable pawls 9 have their respective forward ends which are bent inwardly toward the center of the lower surface of the arm so that the forward ends can hold the reticle at its edge portions of its lower surface. The movable pawls 9C, 9D fasten the cutout 101 of the circular reticle 1, while the movable pawls 9A, 9B fasten the outer periphery of the circular reticle 1. The transport arm 8 is movable in the vertical (Z) direction and the horizontal directions (X, Y directions) by an unillustrated actuator installed on a support 5. When the reticle 1 is transported to the reticle stage 2, the transport arm 8 lifts the reticle 1 upwardly while holding it with the movable pawls 9A, 9B, 9C, 9D.

Figure 11A:
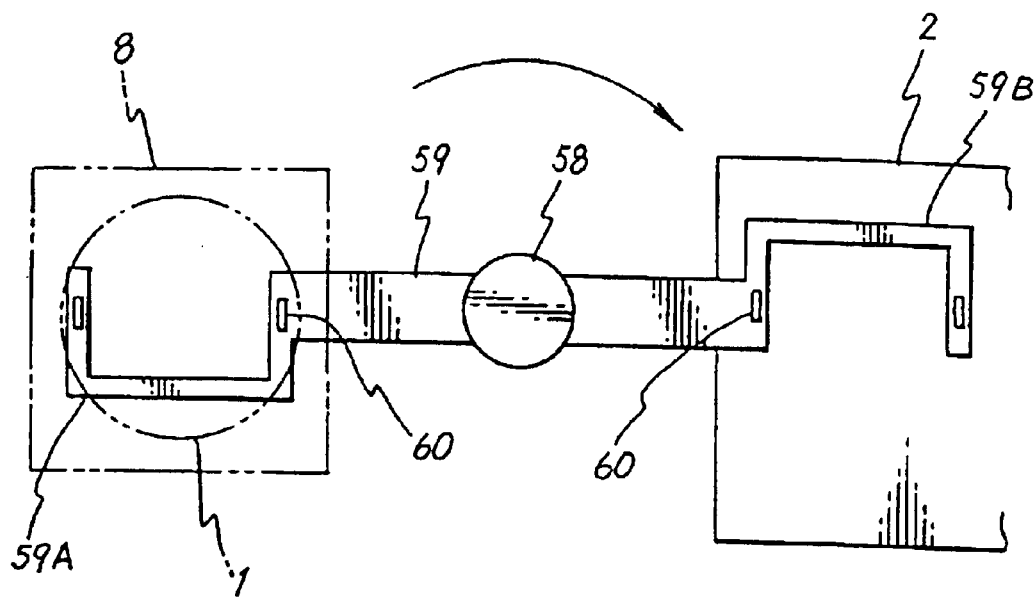
FIGS. 11A and 11B are a top view and a side view of a transport mechanism comprising a rotatable arm for transporting a reticle from a prealignment stage to a reticle stage respectively.
Figure 11B:
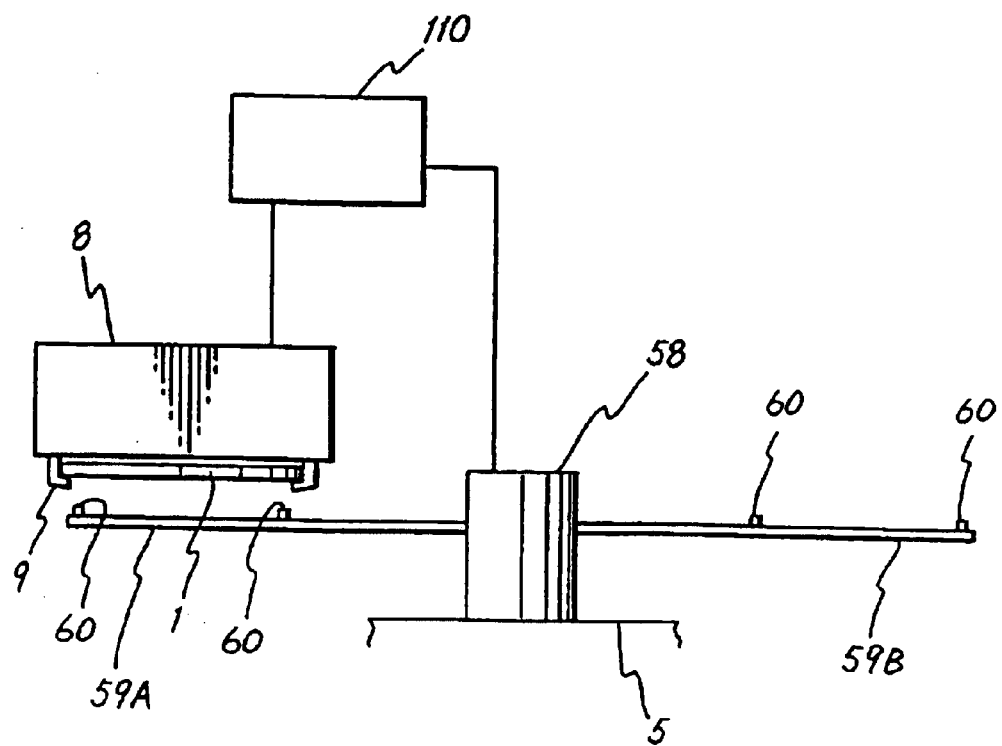

FIG. 11 shows the rotatable arm 59 and its operation for transporting the reticle 1 from the prealignment stage 11 to the reticle stage 2. FIG. 11A illustrates a top view of the transport arm 59, and FIG. 11B illustrates its side view. The rotatable arm 59 includes, at the center in its longitudinal direction, a rotary driving section 58 which represents an axis of rotation. The rotatable arm 59 further includes, at its both sides, an arm section 59A for loading and an arm section 59B for unloading, the both arm sections 59A, 59B being ]-shaped (like a shape of channel). Each of the arm sections 59A, 59B includes a pair of reticle-attracting sections 60. The rotary driving section 58 includes a rotary encoder and an actuator (the both are not shown). When the reticle is lifted up to a predetermined height by the transport arm 8 while being held by the movable pawls 9A, 9B, 9C, 9D of the transport arm 8, the loading arm section 59A of the rotatable arm 59 is moved to a position under the reticle 1 in accordance with rotation using the rotary driving section 58 as the rotation axis. After that, the transport arm 8 is moved downwardly, and the movable pawls are released. Thus the reticle 1 is transmitted to the rotatable arm 59. At this time, the rotatable arm 59 attracts the reticle 1 by using the attracting sections 60, and thus the reticle 1 can be accurately held at a predetermined position on the loading arm section 59A of the rotatable arm 59. After that, the rotatable arm 59 is rotated by the rotary driving section 58 by 180° about the rotary driving section 58. Thus the reticle 1 is transported to the reticle stage 2 while being held by the loading arm section 59A. The reticle 1 can be transported at a high speed owing to the rotary movement by the rotatable arm 59.

The rotary driving section 58 is also movable vertically by an unillustrated actuator. The rotary driving section 58 is moved downwardly after the loading arm section 59A is moved by rotation to a position over the reticle stage 2 so that the reticle 1 is transmitted to a reticle-attracting section for the reticle stage (or the reticle 1 is received in the case of the unloading arm section 59B described below). When the reticle 1 is exchanged, the unloading arm section 59B enters between the reticle stage 2 and the reticle 1 attracted by the reticle-attracting section over the reticle stage 2 during the operation described above to attract the reticle 1 at its back surface. The rotatable arm 59 is moved by rotation while attracting the reticle 1 to be exchanged, and thus the reticle 1 is withdrawn from the reticle stage 2. The transport control unit 110 controls a series of operations in relation to the transport (exchange) of the reticle 1 by the movement of the rotatable arm 59, the transport arm 8, and the movable pawls 9A, 9B, 9C, 9D thereof described above.

In the foregoing, the transport mechanism has been described such that it transports the reticle 1 from the prealignment stage 11 shown in FIG. 2A. However, the transport mechanism itself also includes a prealignment function for the orientation of the reticle. Accordingly, when the reticle 1 is transported to the reticle stage 2, it is also possible to use the transport mechanism singly without using the prealignment stage 11.

Figure 3A:
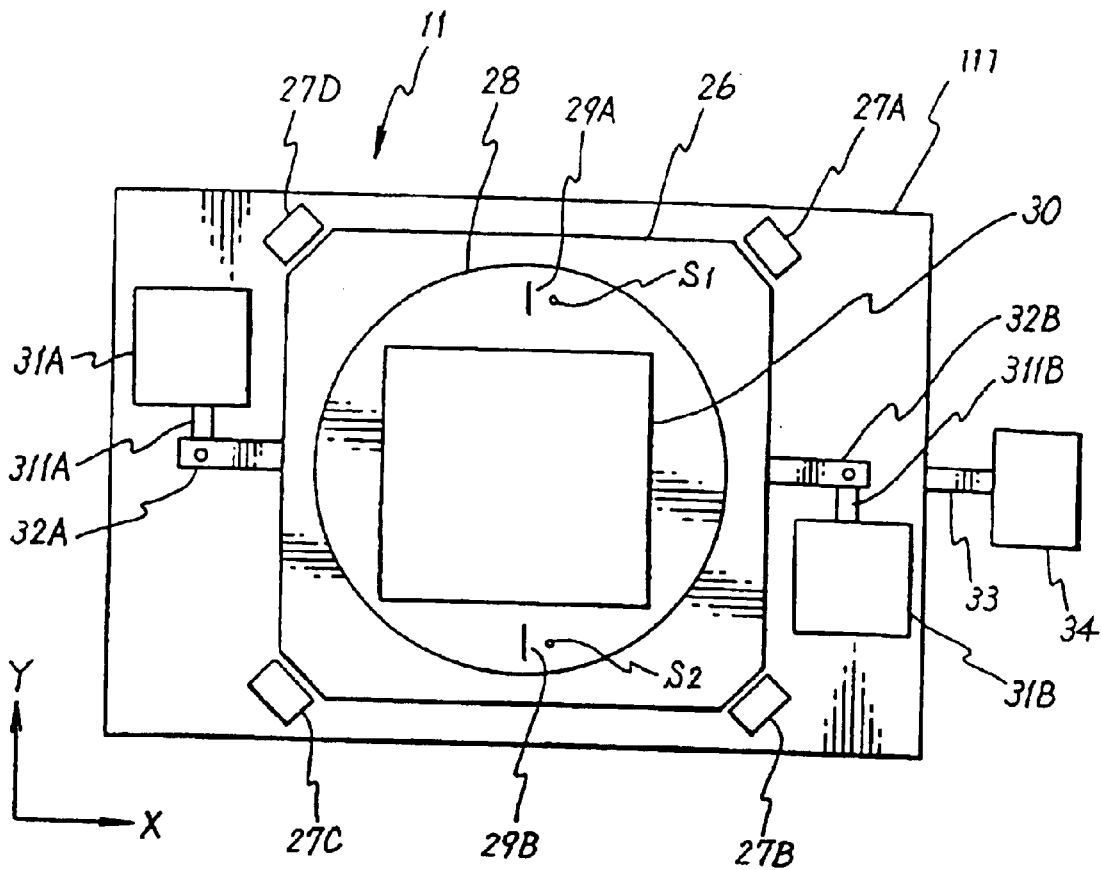
FIGS. 3A and 3B are a top view and a side view of a prealignment stage for a circular reticle without cutout to be used in the projection exposure apparatus of the present invention respectively.
Figure 3B:
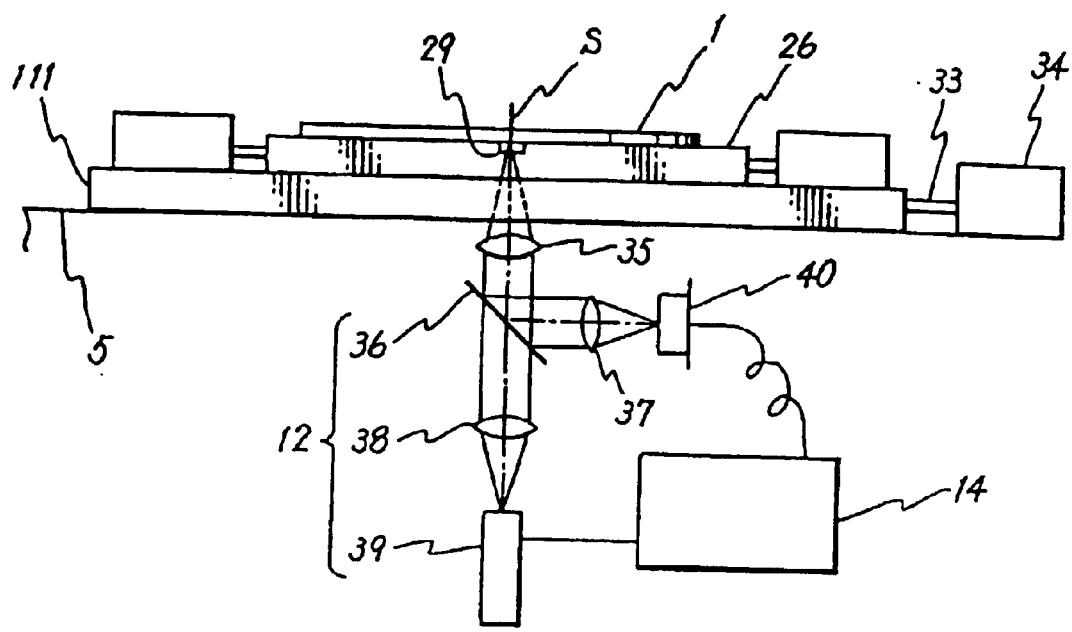

The prealignment stage 11 and the transport mechanism shown in FIG. 2 perform prealignment for the orientation of the reticle especially by using the cutout 101 of the circular reticle on the basis of the contour of the reticle. However, as for a circular reticle 28 without cutout or a reticle having a large error between a reticle contour and a pattern area (drawing error, etc.), the circular reticle 28 can be pre-aligned by using a prealignment stage 11 as shown in FIG. 3. FIGS. 3A and 3B show a plan view and a side view of the prealignment stage 11 respectively. The prealignment stage 11 principally comprises a main stage body 111, a driving unit 34 for moving the main stage body 111, a rotatable stage 26 capable of rotating the circular reticle 28 on the main stage body 111, an optical detecting system 12 installed under the main stage body 111 for detecting the orientation (rotational angle) of the reticle, and a prealignment control unit 14. The main stage body 111 is moved by the driving unit 34 in right and left directions in FIG. 1 (X direction on the support stand 5 shown in FIG. 1). The driving unit 34 can be composed of, for example, an actuator which is able to expand a piston rod 33 by using a motor or the like. The main stage body 111 includes rotatable stage driving units 31A, 31B for driving the rotatable stage 26. The rotatable stage driving units 31A, 31B are disposed on both sides with respect to the rotatable stage 26 on a surface of the main stage body 111. Arms 32A, 32B extend in the X direction toward the outside of the stage 26 at middle positions of side end edges of the rotatable stage 26 extending in the Y direction. Forward ends of the arms 32A, 32B are coupled to forward ends of piston rods 311A, 311B which are expandable from the rotatable stage driving units 31A, 31B. When the piston rods 311A, 311B are protruded, the rotatable stage 26 is rotated through the arms 32A, 32B on the main prealignment stage body 111 by using the center of the reticle 1 as an axis of rotation. The rotatable stage 26 has its four corners which are supported by rotation guides 27A, 27B, 27C, 27D installed on the main prealignment stage body 111. The rotation guides 27 interpose the rotatable stage 26 at its four corners through sliding members such as bearings. The rotatable stage 26 includes, on its surface, an attracting mechanism for attracting the reticle 28 such as a vacuum chuck. The prealignment stage control unit 13 controls the driving of the rotatable stage driving units 31A, 31B, and the driving unit 34 for the main prealignment stage body 111.

The optical detecting system 12 comprises two pairs of LED's 39 for radiating light spots onto the circular reticle 28, sensors 40 for detecting reflected light beams from the reticle 28, and optical systems 35, 36, 37, 38 such as lenses. Each of the sensors 40 and the optical systems 35 to 38 are disposed under the main prealignment stage body 111 at positions at which the main prealignment stage body 111 is divided into two halves in the Y direction, and they are separated from the center of the main stage body 111 by an equal distance. The distance between the two sensors 40 is approximately equal to a spacing distance between a pair of marks 29A, 29B affixed at positions outside a pattern area 30 on the circular reticle. Light beams emitted from the respective LED's 39 pass through the lenses 38, the half mirrors 36, and the lenses 35, and they are collected on a lower surface of the reticle 28 to form light spots S1 and S2 respectively. When the pair of marks 29A, 29B on the circular reticle are irradiated with the light spots S1 and S2, reflected light beams from the marks 29A, 29B are detected by sensors 40 through the half mirrors 36 and the lenses 37. Signals detected by the sensors 40 are sent to the prealignment control unit 14 described above. In order to irradiate the circular reticle with the irradiation light beams from LED's 39, passages for transmitting the irradiation light beams (not shown) are formed at the insides of the prealignment stage 111 and the rotatable stage 26. When the both stages are composed of a light-transmitting material, such passages are unnecessary.

Figure 4:
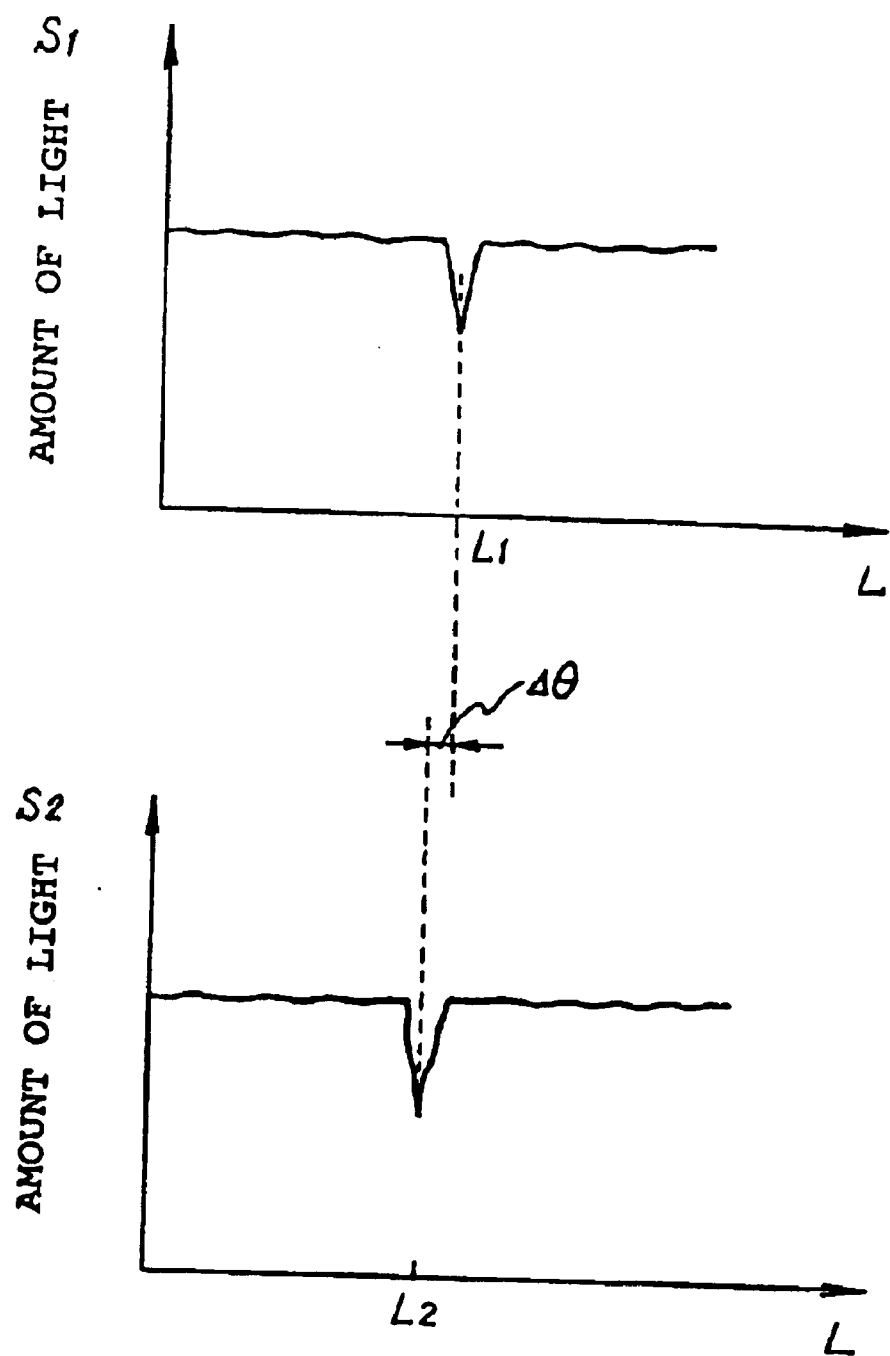
FIG. 4 shows relationships between movement amounts of the reticle prealignment stage and output signals from sensors 40 for detecting prealignment marks on the reticle by using light spots S1 and S2.

An operation for pre-aligning the orientation of the circular reticle by using the prealignment stage 11 arranged as described above will be explained below. At first, the reticle 28 is attracted onto the rotatable stage 26. After that, when the main prealignment stage body 111 is driven by the driving unit 34 in the X direction (from left to right in FIG. 3), the reticle 28 attracted and held by the rotatable stage 26 is also moved in the same direction. During the movement of the reticle 28, LED's 39 radiate light beams onto predetermined areas on the lower surface of the reticle 28. When the marks 29A, 29B on the reticle 28 pass across the light spots S1 and S2 formed by LED's 39, reflected light beams from the marks 29A, 29B come into the respective sensors 40 through the half mirrors 36 and the lenses 37. Optical signals received by the respective sensors 40 are subjected to A/D conversion in synchronization with a count value of an encoder in the driving unit 34, and they are inputted into the prealignment control unit 14. FIG. 4 shows relationships between intensities of the reflected light beams concerning S1 and S2 and movement amounts L of the main stage body 111 moved by the driving unit 34. L1 and L2 indicate positions at which the marks 29A, 29B on the reticle are detected by the respective sensors. Therefore, a difference between L1 and L2 represents an orientational error of the circular reticle 28, that is a rotational error Δθ to be corrected for rotation. The prealignment control unit 14 receives signals for indicating the positions of L1 and L2 from the sensors 40, and it calculates Δθ from the difference therebetween so that a voltage signal corresponding to Δθ is sent to the rotatable stage driving units 31A, 31B through the prealignment stage control unit 13 to rotate the rotatable stage 26 by a certain angle Δθ. Accordingly, the orientation of the circular reticle, namely the frontage in the rotational direction is adjusted on the prealignment stage 11. The operation described above is controlled by the prealignment stage control unit 13 which is under the control of the main control unit 100.

The circular reticle 28 with its orientation having been adjusted on the prealignment stage 11 is transported to the reticle stage 2 by the transport mechanism described above (see FIG. 2B, and FIGS. 11A and 11B). However, in this embodiment, the pawls 9A, 9B, 9C, 9D of the transport arm can be arranged in conformity with the contour of the circular reticle having no cutout.

The mechanism of the prealignment stage 11 as shown in FIGS. 3A and 3B may be incorporated into the lower surface of the transport arm in place of the pawls 9A, 9B, 9C, 9D of the transport arm as shown in FIG. 2B. By doing so, the circular reticle having no cutout can be pre-aligned and transported to the reticle stage 2.

Figure 12:
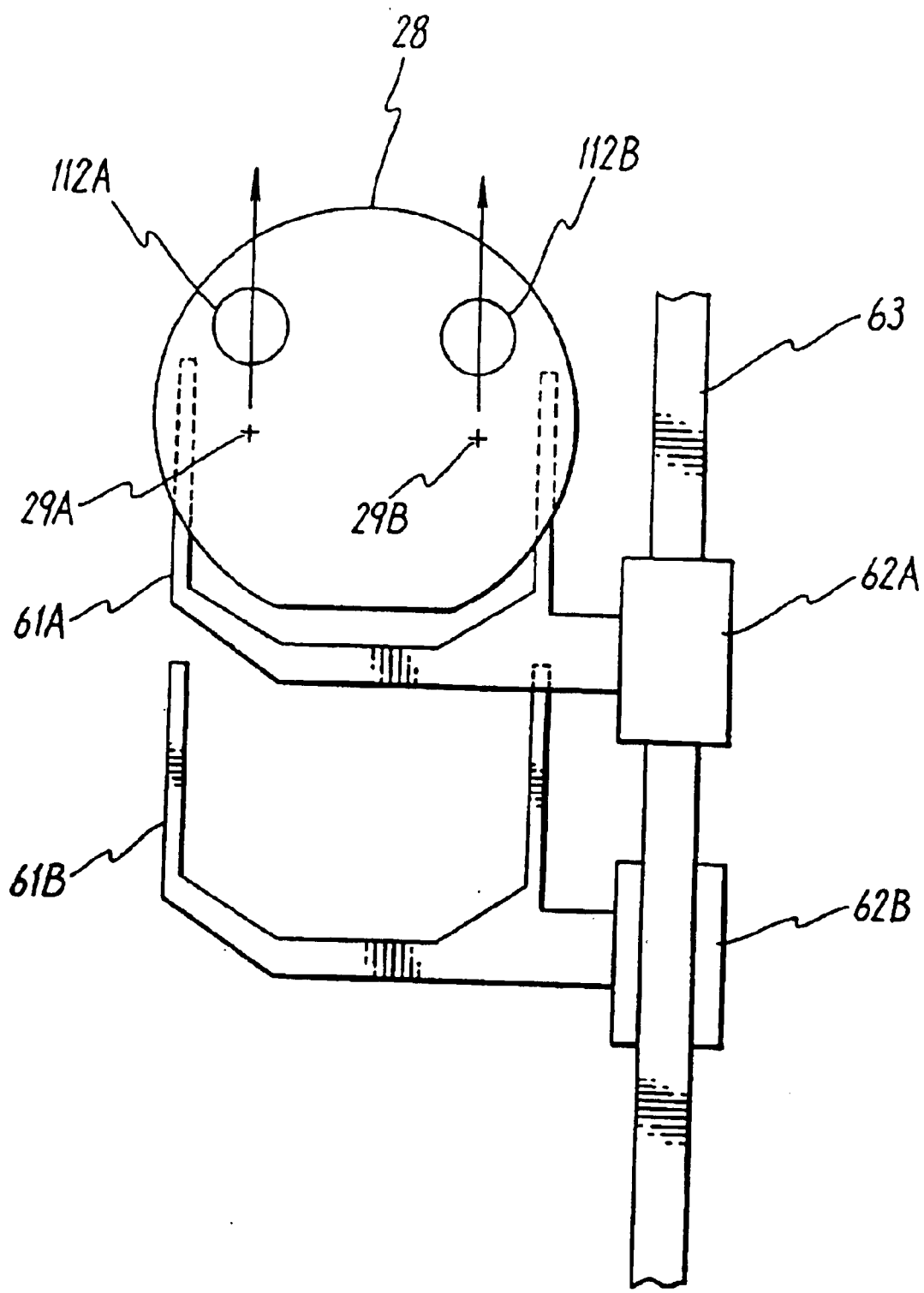
FIG. 12 is a top view conceptually showing another embodiment of the transport mechanism.

Another embodiment of the transport mechanism is shown in FIG. 12. In FIG. 12, linear motor driving sections 62A, 62B are arranged at upper and lower positions along a linear motor guide 63 so that the reticle 28 is transported from the prealignment stage 11 to the reticle stage 2 in this arrangement. The linear motor driving section 62A holds a load arm 61A. The reticle 28 can be attracted onto the load arm 61A at contact portions between the load arm 61A and the reticle 28A by using a vacuum chuck. On the other hand, the linear motor driving section 62B holds an unload arm 61B. The reticle 28 can be attracted thereonto in the same manner as the load arm 61A. This arrangement further comprises alignment optical systems 112A, 112B capable of measuring reticle marks 29A, 29B during transport of the reticle 28 by using the load arm 61A. The reticle 28 is accurately arranged on the reticle stage 2 in accordance with an alignment result determined from waveform signals sampled in synchronization with output values of an encoder provided along the linear motor guide 63.

Figure 13A:
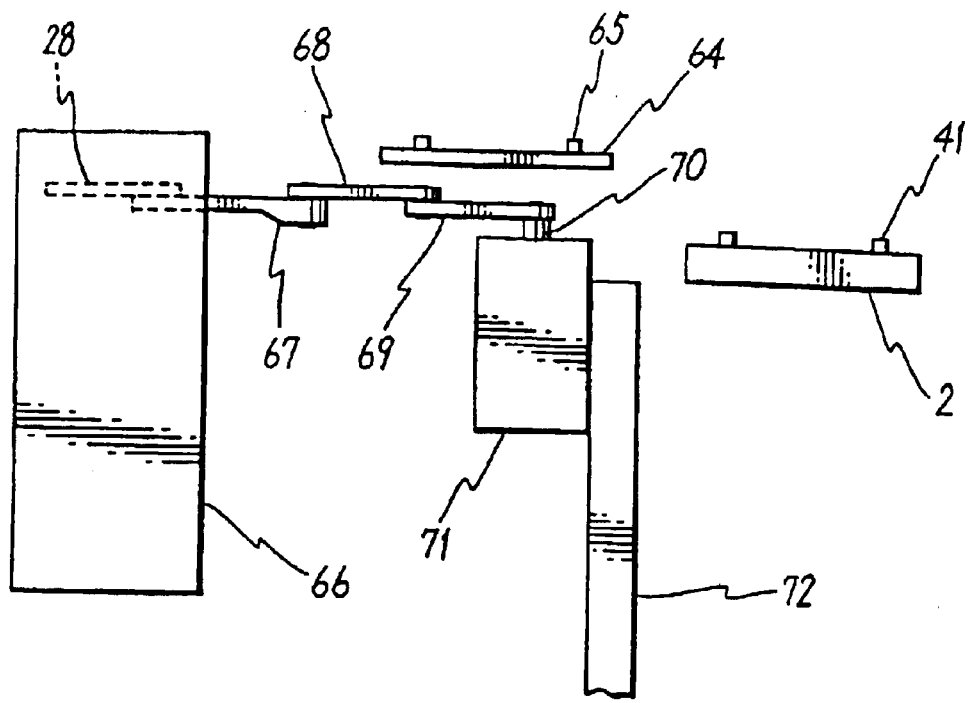
FIGS. 13A and 13B are a side view and a top view of a mechanism for directly transporting a reticle from a reticle library to a reticle stage respectively.
Figure 13B:
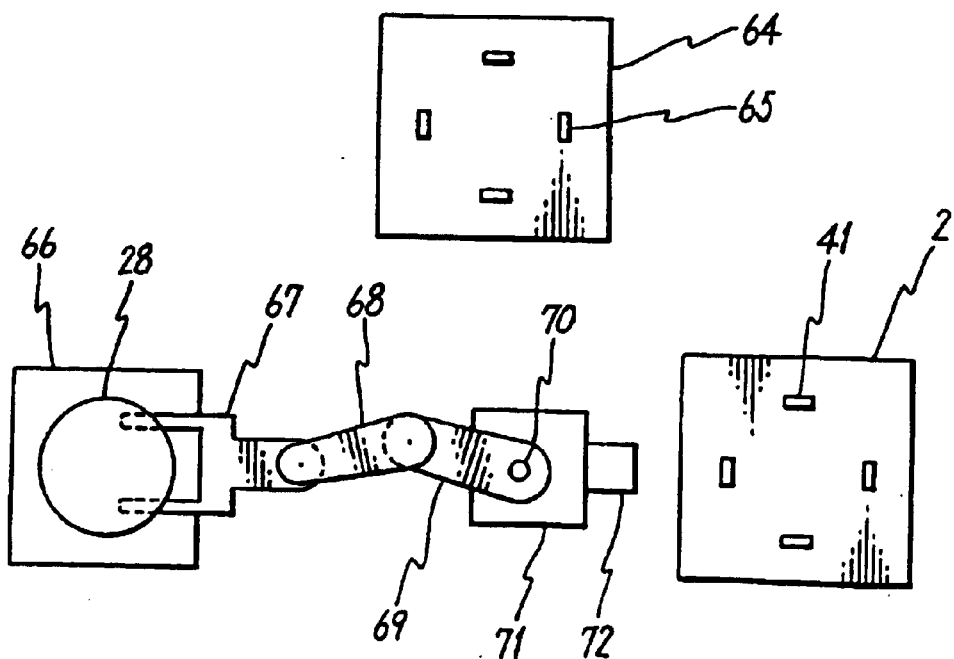

Next, a mechanism for directly transporting the reticle 28 from a reticle library 66 to the reticle stage 2 with reference to FIG. 13. FIGS. 13A and 13B show a side view and a top view of principal parts respectively. A robot control system 71 is driven vertically along a guide 72 for vertically driving the robot control system 71. A reticle stored at an arbitrary position in the reticle library is received by expanding robot arms 69, 68, 67. A rotary driving shaft 70 is rotated in a state in which the robot arms are contracted so that the reticle is deflected to a direction toward the reticle stage 2. The reticle 28 is placed on the reticle stage 2 by expanding the robot arms again. In this procedure, it is time-consuming to transport the reticle from the reticle library 66 every time. Accordingly, there is provided a mechanism to allow a reticle secondly transported or an unloaded reticle to wait on a reticle waiting stage 64. This embodiment has been explained such that one robot arm is used as shown in FIG. 13. However, when it is required to exchange multiple reticles at a high speed, two robot arms may be arranged to provide a system for simultaneously performing loading and unloading for the reticles.

Figure 5A:
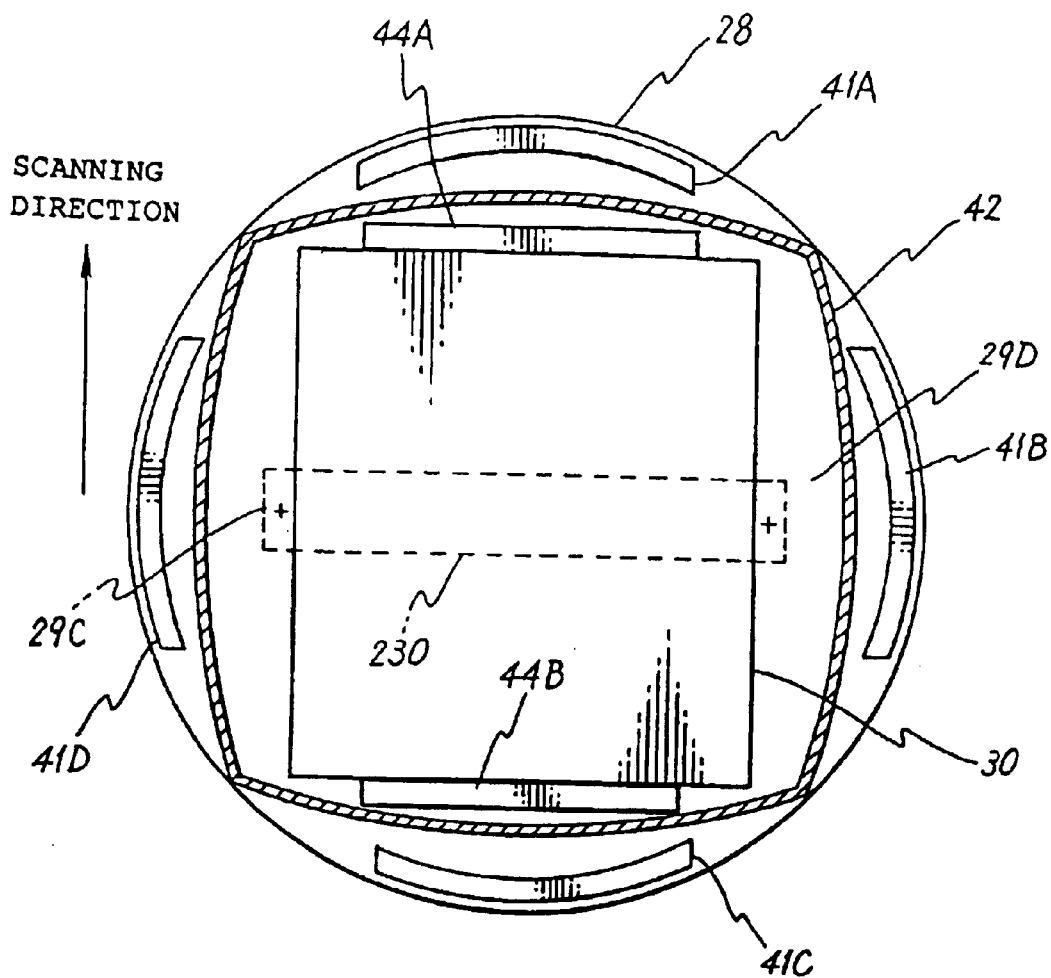
FIGS. 5A and 5B are a top view and a side view of an embodiment of a circular reticle used in the present invention respectively.
Figure 5B:
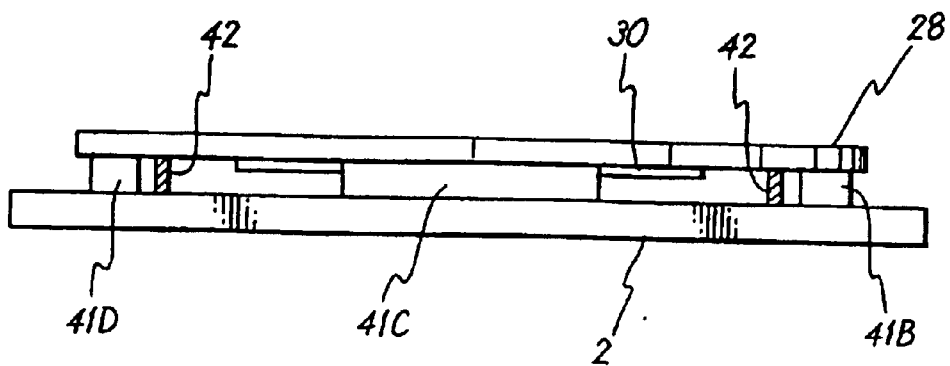

Next, the structure of the circular reticle used in the reduction projection exposure apparatus described above will be explained. FIGS. 5A and 5B are a plan view and a side view of a circular reticle 28 preferably used for the projection exposure apparatus of the present invention respectively. In FIG. 5A, the circular reticle 28 has a rectangular or square pattern area 30 at its inside, and respective vertexes of the pattern area 30 are located at positions spaced apart from the circumference of the circular reticle 28 by an equal distance. It is assumed that the circular reticle 28 is scanned by the reticle stage 2 in a direction of an arrow in FIG. 5A (hereinafter referred to as "scanning direction"). Circular arc-shaped attracting sections (ridge-shaped support sections) 41A, 41B, 41C, 41D are disposed outside the pattern area 30 on the reticle stage 2, which extend along the circumference of the reticle in the scanning direction and a direction perpendicular thereto. A circular arc-shaped pellicle frame 42 exists at respective areas between the pattern area 30 and the attracting sections 41A, 41B, 41C, 41D. The radius for forming the circular arc of the pellicle frame 42 is larger than the radius of the circular reticle 28. Reticle marks 29C, 29D and teg marks 44A, 44B are arranged outside the pattern area 30 and inside the pellicle frame 42. The reticle marks 29C, 29D are arranged in the direction perpendicular to the scanning direction, and the teg marks 44A, 44B are arranged in the scanning direction. Especially, the reticle marks 29C, 29D are set to have a spacing distance therebetween so that they are simultaneously included in an illumination field 230 on the reticle 28. The arrangement of the pellicle frame 42 as shown in FIG. 5A makes it possible to effectively use the area within the pellicle. The formation of the pellicle frame 42 to have the shape as shown in FIG. 5A improves durability of the pellicle film against external force such as vibration. In addition, the pellicle frame 42 itself is not subject to interference with other members. As shown in the side view in FIG. 5B, the circular reticle 28 is held by the reticle stage 2 through the reticle-attracting sections 41A to 41D on the reticle stage 2.

In FIG. 5A, the marks 29C, 29D exist in the direction perpendicular to the scanning direction with the pattern area 30 interposed therebetween. Accordingly, the teg marks are arranged in the scanning direction respectively with the pattern area 30 interposed therebetween. The length of the teg mark is shorter than the width of the pattern area 30 (length of the pattern area in the direction perpendicular to the scanning direction). However, sufficient areas for the teg marks are ensured without interference with the pattern area 30.

Figure 6:
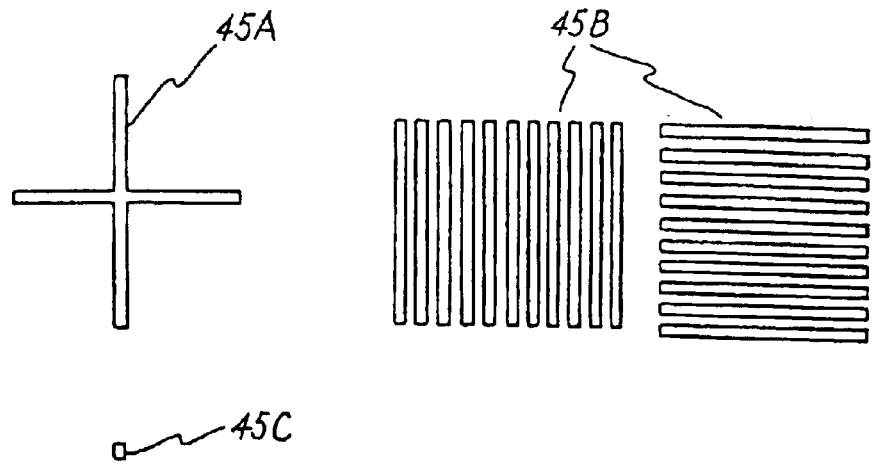
FIG. 6 shows shapes of representative marks included in a teg mark on the reticle.
Figure 7A:
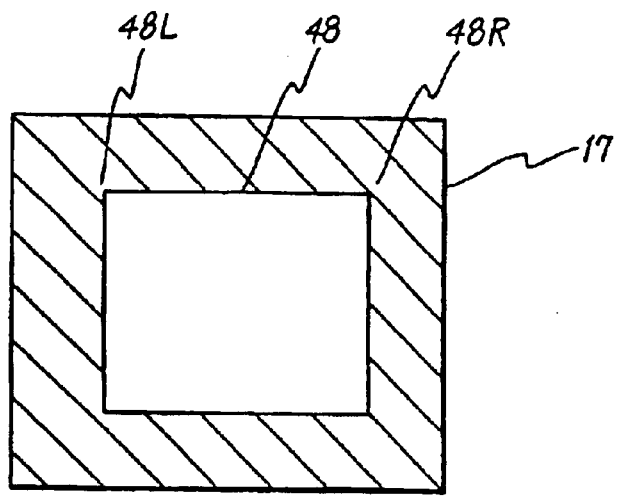
FIGS. 7A and 7B are a plan view and a side view of a sensor for spatial image measurement respectively.
Figure 7B:
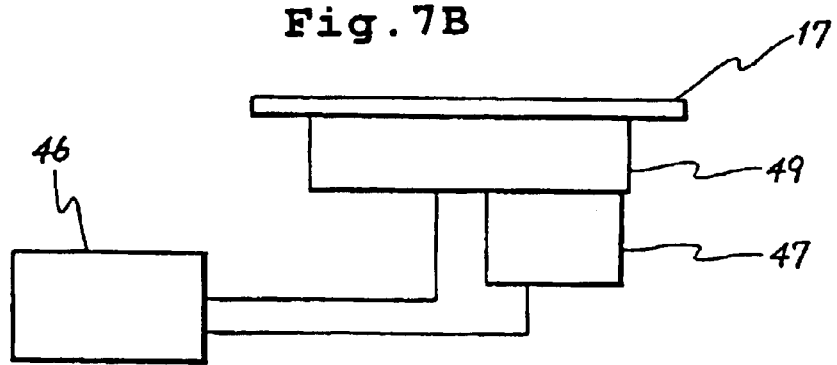

Isolated marks 45A, L/S marks 45B, and contact hole marks 45C as shown in FIG. 6 are formed in the teg marks 44A, 44B respectively. Each type of the marks includes a plurality of individuals so that they have different pitches, line widths, and sizes. Minimum values of the pitches, line widths, and sizes are coincident with a resolution of the projection optical system 15. The use of these marks makes it possible to inspect the entire plane of the projection field of the projection optical system 15. These teg marks are detected by a pattern frame for spatial image measurement 17 which is arranged on the wafer stage 57 shown in FIG. 1 at a height substantially coincident with the position of the wafer surface. FIG. 7A shows a plan view of the pattern frame for spatial image measurement 17. The frame for spatial image measurement 17 is made of chromium, having an aperture 48 formed at its inside. As shown in FIG. 7B, a sensor 49, which can receive a light beam in a range up to N.A=1, is installed under the aperture 48. The sensor 49 is installed with a cooling unit 47 for keeping the temperature of the sensor constant. Accordingly, occurrence of signal drift is avoided. Signals from the sensor 49 are processed by a spatial image measuring unit 46.

Now explanation will be made for a calibration operation by using the teg marks and the pattern frame for spatial image measurement 17 described above in the case of projection exposure performed in accordance with the step-and-scan system. When the step-and-scan system is used, exposure is performed while relatively scanning the reticle stage 2 and the wafer stage 57 with respect to the projection optical system 15 (FIG. 1). When exposure for all shot areas on the wafer 16 is completed, the wafer 16 is withdrawn by the wafer stage 57 from the exposure field of the projection optical system 15 in order to exchange the wafer 16 for a new wafer to be subsequently exposed. During the wafer exchange operation, the position of the wafer stage 57 is adjusted so that the pattern frame for spatial image measurement 17 is located within the exposure field of the projection optical system 15. In this procedure, the movement of the reticle stage 2 is controlled so that the teg marks 44 on the reticle 1 are located at positions at which the teg marks 44 and the pattern frame for spatial image measurement 17 located within the exposure field are conjugate with each other through the projection optical system 15. The adjustment for the wafer stage 57 and the control for the reticle stage 2 can be performed by using the wafer stage control unit 21 and the reticle stage control unit 6 which are under the control of the main control unit 100. The operation for controlling the wafer stage 57 and the reticle stage 2 and arranging the teg marks 44 on the reticle 1 and the pattern frame for spatial image measurement 17 in the conjugate relation through the projection optical system 15 is included in a sequence for wafer exposure processing as one step after the completion of exposure process for each wafer and during the period for the exchange operation for the next wafer, which is managed by the main control unit 100.

Figure 8A:
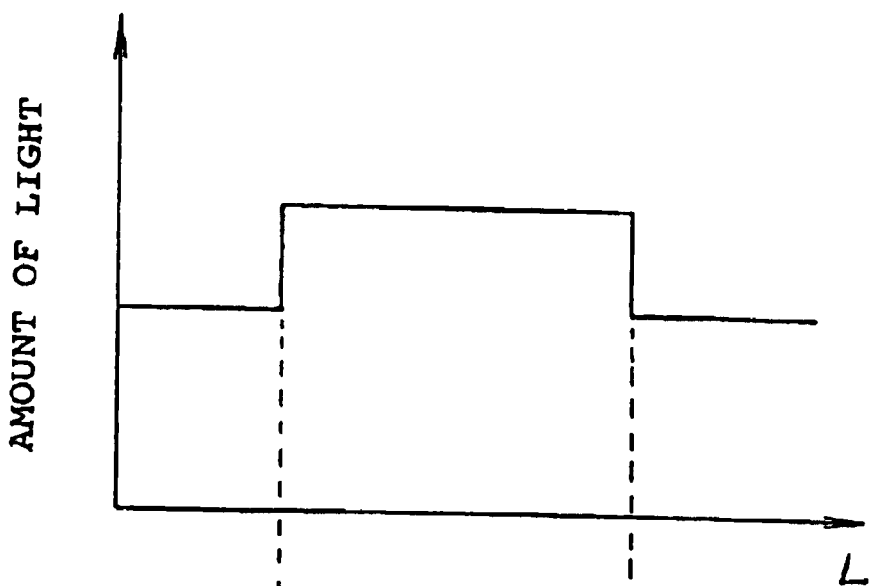
FIGS. 8A and 8B shows an output signal waveform of a spatial image and a differentiated signal waveform obtained therefrom respectively when the mark 45A in FIG. 6 is scanned.
Figure 8B:
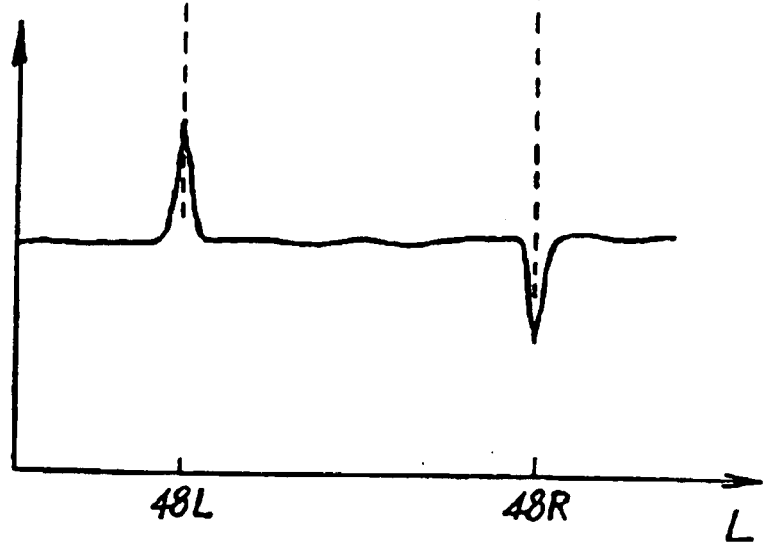

The arrangement in the conjugate relation between the teg marks 44 on the reticle 1 and the pattern frame for spatial image measurement 17 through the projection optical system 15 during the wafer exchange as described above allows various types of calibration to be performed by using the teg marks 44 on the reticle 1. After the teg mark 44 on the reticle 1 and the pattern frame for spatial image measurement 17 are arranged in the conjugate relation as described above, the reticle stage 2 is moved in the scanning direction (Y direction). Thus a chromium pattern (for example 45A in FIG. 6) in the teg mark 44 crosses the aperture 48 of the frame for spatial image measurement 17. At this time, the sensor 49 outputs a waveform as shown in FIG. 8A. The axis of abscissa in FIG. 8A represents the movement distance of the reticle 1. The amount of light received by the sensor 49 changes when the chromium pattern 45A passes over the aperture 48 (between ends 48L and 48R) of the frame for spatial image measurement 17, and thus a signal as shown in FIG. 8A is generated. This signal is linearly differentiated by the spatial image measuring unit 46, and a spatial image as shown in FIG. 8B is detected.

Calibration for focusing, positional error, image quality and so on can be performed by detecting the spatial image as described above. For example, the best focus position can be confirmed by detecting waveforms as shown in FIG. 8B by the sensor 49 while varying the wafer stage in the Z direction during the calibration, and detecting the difference in contrast therebetween. The image quality can be inspected on the basis of asymmetricalness of right and left halves of a spatial image. The lens distortion can be inspected by successively measuring a group of marks in the teg mark 44 since they are aligned at every constant pitch. Such data possibly change at every moment depending on an environment of the lenses during exposure. Accordingly, it is effective to perform the measurement during the wafer exchange as described above. The throughput of exposure process can be improved by performing the measurement during the wafer exchange. It is noted that the calibration method by using the teg mark described above is not limited to the circular reticle, which can be also applied to an ordinary rectangular reticle.

Figure 9A:
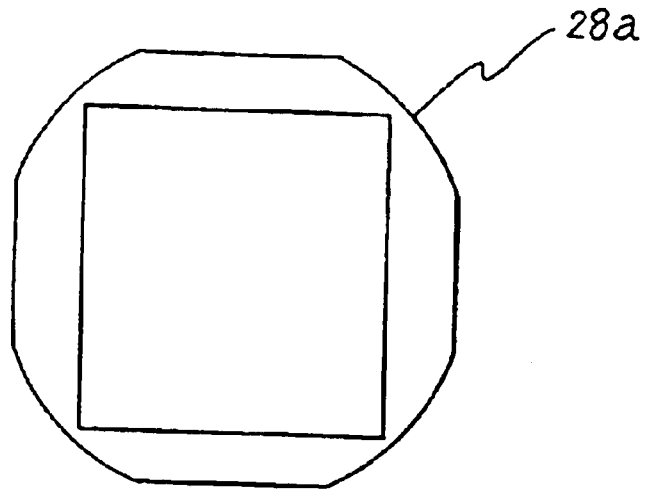
FIGS. 9A, 9B and 9C show exemplary shapes of circular reticles which can be used in the projection exposure apparatus of the present invention.
Figure 9B:
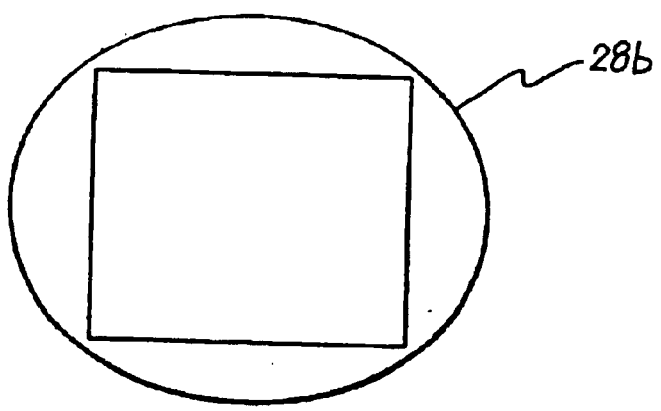
Figure 9C:
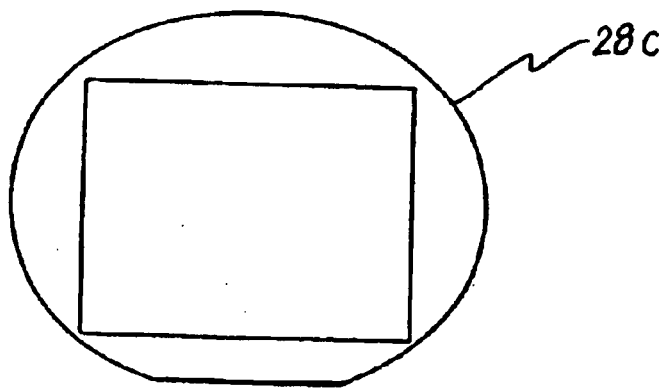
Figure 10A:
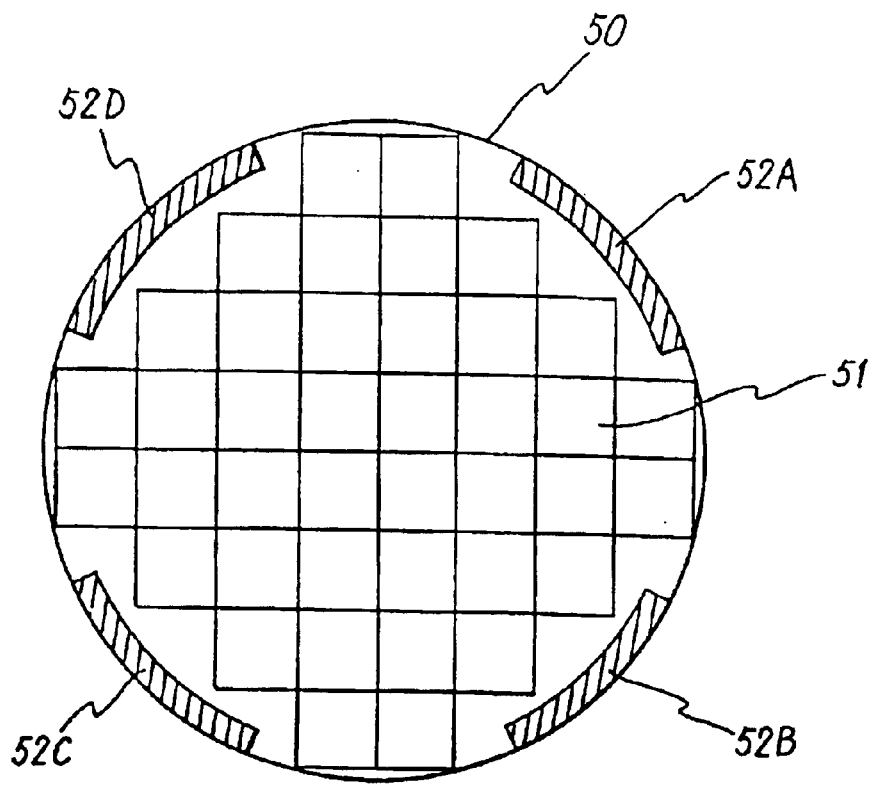
FIGS. 10A and 10B are plan views showing a typical example of the mask shape used in the mirror projection exposure system, and a typical example of the reticle shape used in the stepper respectively.
Figure 10B:
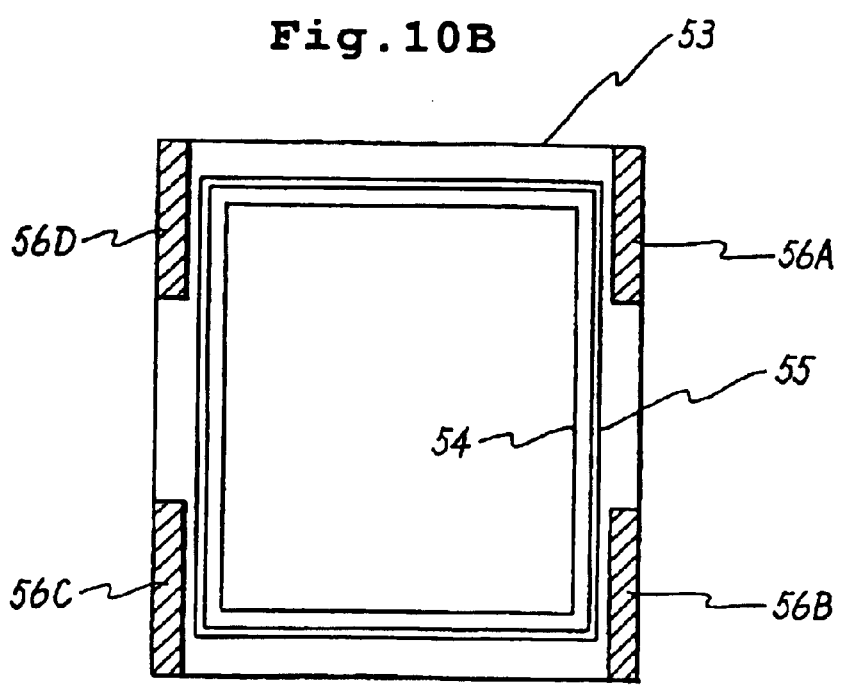

In relation to the projection exposure apparatus of the present invention, the circular reticle has been explained as exemplified by the circular reticle as shown in FIG. 3A and the circular reticle having one cutout at its outer periphery as shown in FIG. 2A. However, it is also possible to use a circular reticle having a plurality of cutouts as shown in FIG. 9A, an elliptical reticle as shown in FIG. 9B, an elliptical reticle having a cutout as shown in FIG. 9C, a reticle having a notch (V-shaped cutout) and so on. The size and the arrangement of the pattern area in the reticle are not limited to those shown in FIG. 9, and various sizes and arrangements can be adopted.

In the embodiments described above, the prealignment stage 11 and the reticle stage 2 have been provided on the identical column (support stand 5). However, they may be arranged on separate support stands respectively.

The projection exposure apparatus of the present invention is provided with the prealignment stage which can previously correct the rotational error of the circular reticle having the rectangular pattern area. Accordingly, it is unnecessary to perform an operation to place the reticle on the reticle stage again even when the rotational error is large. The projection exposure apparatus of the present invention can realize projection exposure by using the circular reticle or the elliptical reticle which is advantageous for semiconductor production and the like. The projection exposure apparatus of the present invention makes it possible to perform projection exposure by using the circular reticle. Thus it is possible to contemplate improvement in foot print and development of a reticle stage having a light weight owing to the minimized and restricted reticle area. According to the method for performing calibration of the present invention, for example, the projection optical system can be efficiently calibrated during the wafer exchange in the projection exposure in accordance with the step-and-scan system. Accordingly, the throughput can be improved.

It will be understood by those skilled in the art that the present invention may be carried out in other various forms without departing from the spirit or essential characteristics thereof. All variations and modifications which come within the equivalent range of the claims are embraced in the scope of the present invention.

What is claimed is:

1. A projection exposure apparatus for exposing a photosensitive substrate with a pattern formed on a circular mask having a rectangular pattern area by projection through a projection optical system, comprising:

an illumination optical system for illuminating the circular mask;

a mask stage;

a stage for moving the photosensitive substrate two-dimensionally;

a prealignment stage for pre-aligning the circular mask for its orientation, the prealignment stage comprising a detecting means for detecting an orientational error of the circular mask from a predetermined orientation on the prealignment stage, a rotatable means for rotating the circular mask on the prealignment stage, and a control means for controlling the rotatable means on the basis of the orientational error so that the circular mask has the predetermined orientation; and a transport means for transporting the circular mask from the prealignment stage to the mask stage while maintaining a pre-aligned orientation of the circular mask.

2. The projection exposure apparatus according to claim 1, wherein the detecting means comprises two optical sensors for detecting at least two marks formed on the circular mask respectively, a moving unit for relatively moving the prealignment stage with respect to the optical sensors so that each of the two marks on the circular mask relatively passes across each of optical paths of the optical sensors, and a calculating means for calculating the orientational error on the basis of a difference between detected positions of the mark detected by the two optical sensors, and wherein the rotatable means is composed of a rotatable stage installed on the prealignment stage.

3. The projection exposure apparatus according to claim 1, wherein the transport means comprises a transport arm having at least three pawls for grasping the circular mask, a rotatable arm having an attracting section for attracting the circular mask for transporting the circular mask from the prealignment stage to the mask stage by performing rotary movement, and a transport control unit for controlling operations of the transport arm and the rotatable arm.

4. The projection exposure apparatus according to claim 1, wherein the mask stage includes an attracting section for holding the circular mask at a position outside each side of a rectangle which defines the pattern area in the circular mask.

5. A projection exposure apparatus for exposing photosensitive substrate with a pattern formed on a circular mask having a rectangular pattern area and having a cutout by projection through a projection optical system, comprising:

an illumination optical system for illuminating the circular mask, a mask stage, a stage for moving the photosensitive substrate two-dimensionally, a prealignment stage for prealigning the circular mask, the prealignment stage comprising two fastening sections for fastening the cutout of the circular mask, and a movable pin for moving the circular mask on the prealignment stage, and a transporter for transporting the prealigned circular mask from the prealignment stage to the mask stage.

6. The projection exposure apparatus according to claim 5, wherein the transporter comprises a transport arm having at least three pawls for grasping the circular mask for fastening the cutout of the circular mask by using two pawls of the at least three pawls, a rotatable arm having an attracting section for attracting the circular mask for transporting the circular mask from the prealignment stage to the mask stage by performing rotary movement, and a transport control unit for controlling operations of the transport arm and the rotatable arm.

7. The projection exposure apparatus according to claim 5 wherein the mask stage includes an attracting section for holding the circular mask at a position outside each side of a rectangle which defines the pattern area in the circular mask.

8. A projector exposure apparatus for exposing a photosensitive substrate with a pattern formed on a circular mask having a rectangular pattern area and having a cutout by projection through a projection optical system, comprising:

an illumination optical system for illuminating the circular mask, a mask stage, a stage for moving the photosensitive substrate two-dimensionally, and maintaining a prealigned orientation of the circular mask, wherein the transporter comprises a transport arm having at least three pawls for grasping the circular mask for performing prealignment for the circular mask by fastening the cutout of the circular mask with two pawls of the at least three pawls, a rotatable arm having an attracting section for attracting the circular mask for transporting the circular mask to the mask stage by performing rotary movement, and a transport control unit for controlling operations of the transport arm and the rotatable arm.

9. The projection exposure apparatus according to claim 8, wherein the mask stage includes an attracting section for holding the circular mask at a position outside each side of a rectangle which defines the pattern area in the circular mask.

10. The projection exposure apparatus according to claim 8, wherein the projection exposure apparatus is a reduction projection exposure apparatus.

11. A projection exposure apparatus for exposing a photosensitive substrate with a pattern formed on a circular mask having a rectangular pattern area by projection through a projection optical system, comprising:

an illumination optical system for illuminating the circular mask, a mask stage a stage for moving the photosensitive substrate two-dimensionally, a prealignment stage, for prealigning the circular mask for its orientation, comprising a detector for detecting an orientational error of the circular mask from a predetermined orientation on the prealignment stage, a rotation device for rotating the circular mask on the prealignment stage, and a controller for controlling the rotation device on the basis of the orientational error so that the circular mask has the predetermined orientation, and a transporter for transporting the circular mask from the prealignment stage to the mask stage while maintaining a prealigned orientation of the circular mask.

12. An exposure apparatus for transferring an image of a pattern formed on a mask through a projection optical system onto a substrate, comprising:

a mask stage on which the mask is placed, and a prealignment device comprising a detector which optically detects a plurality of marks formed on the mask, a calculator which calculates a rotational error of the mask based on a detection result of the detector, and a driving system which moves the mask based on a calculation result of the calculator, the detector detecting the mark before the mask is placed on the mask stage, wherein the driving system is rotatable about a rotational axis thereof to rotate the mask, and a center of the mask is positioned approximately on the rotational axis.

13. The exposure apparatus according to claim 12, wherein the mask has a circular shape.

14. The exposure apparatus according to claim 13, wherein the circular shape is an ellipse or a circle.

15. The exposure apparatus according to claim 12, wherein the prealignment device comprises a prealignment stage, which is different from the mask stage and wherein the driving system rotates on the prealignment stage.

16. An exposure method for exposing a substrate through a reduction projection optical system with a pattern formed on a circular mask which is placed on a mask stage comprising:

detecting a plurality of marks formed on the circular mask to determining orientation information of the circular mask based on a detection result of the marks, prealigning the circular mask based on the orientation information, an transporting the circular mask onto the mask stage while maintaining an orientation of the prealigned circular mask.

17. The exposure method according to claim 16, wherein the circular mask has a rectangular patterning area on which the pattern is formed.

18. The exposure method according to claim 16, wherein the circular mask has a shape of a circle or an ellipse.

19. The exposure method according to claim 16, wherein the prealigning of the circular mask includes rotating the circular mask.

20. The exposure method according to claim 19, wherein the rotating of the mask is carried out by rotating the mask stage on which the circular mask is placed.

21. A method of fabricating a circuit pattern by transferring the pattern of the mask onto the substrate using the method according to claim 16.

22. An exposure method for exposing a substrate with a pattern formed on a mask which is placed on a mask stage, comprising:

detecting a mark formed on the mask prior to placement of the mask on the mask stage, determining orientation information of the mask based on a detection result of the mark, and rotating the mask about a predetermined point as a rotational axis based on the orientation information of the mark.

23. The exposure method according to claim 22, wherein the mask is placed on the mask stage after the rotation of the mask.

24. The exposure method according the claim 23, wherein a center of the mask is positioned approximately on the rotational axis.

25. The exposure method according to claim 22, wherein the mark includes a plurality of sub-marks formed on the mask and the sub-marks are detected by a plurality of detecting optical systems, respectively.

26. The exposure method according to claim 22, wherein the substrate is exposed by transferring an image of the pattern formed on the mask through a reduction projection optical system.

27. A method for fabricating a circuit pattern by a transferring the pattern of the mask onto the substrate using the method according to claim 26.

28. The exposure method according to claim 22, wherein the mask has a circular shape.

29. The exposure method according to claim 28, wherein the circular shape is a circle or an ellipse.

30. A method for manufacturing an exposure apparatus which exposes a substrate with a pattern formed on a circular mask which is placed on a mask stage by projecting the pattern onto the substrate while reducing a size of the pattern comprising providing a reduction projection optical system which projects the pattern on the circular mask onto the substrate while reducing a size of the pattern;

providing a mask stage providing a prealignment device which detects a plurality of marks formed on the circular mask to determine orientation information of the circular mask based on a detection result of the marks, and prealigns the circular mask based on the orientation information, and providing a transporter which transports the circular mask to the mask stage while maintaining an orientation of the prealigned circular mask.

31. The method according to claim 30, wherein the circular mask has a rectangular patterning area on which the pattern is formed.

32. The method according to claim 30, wherein the prealignment device rotates the circular mask.

33. A method for manufacturing an exposure apparatus which exposes a substrate with a pattern formed on a mask, comprising, providing a mask stage on which the mask is placed;

providing a detecting system, which detects a mark formed on the mask before the mask is placed on the mask stage, providing a rotation detecting device which is electrically connected to the detecting system; and detects a rotation of the mask based on a detection result of the mark, and providing a driving system which is electrically connected to the rotation detecting device, and is rotatable about a rotational axis of the driving system to rotate the mask about the rotational axis based on the detected rotation of the mask.

34. The method according to claim 33, further comprising providing a transporting system which is electrically connected to the driving system and transports the mask onto the mask stage after the rotation of the mask by the driving system.

35. The method according to claim 34, wherein a center of the mask is positioned approximately on the rotational axis.

36. The method according to claim 33, wherein the mark includes a plurality of sub-marks formed on the mask, the detecting system includes a plurality of detecting optical systems for detecting the respective sub-marks.

37. The method according to claim 33, further comprising a reduction projection optical system which is arranged between the mask stage and the substrate, and process the pattern of the mask onto the substrate while reducing a size of the pattern.

38. The method according to claim 33, wherein the mask has a circular shape.

39. An exposure apparatus for exposing a substrate with a pattern formed on a mask, comprising:

a mask stage which places the mask thereon, the mask having a mark formed thereon.

a detecting system which detects the mark formed on the mask before the mask is placed on the mask stage, a rotation detecting device which is electrically connected to the detecting system and detects a rotation of the mask based on a detection result of the mark, and a driving system which is electrically connected to the rotation detecting device, and is rotatable about a rotational axis of the driving system to rotate the mask about the rotational axis based on the detected rotation of the mask.

40. The exposure apparatus according to claim 39, further comprising a transporting system which is electrically connected to the driving system and transports the mask onto the mask stage after the rotation of the mask by the driving system.

41. The exposure apparatus according to claim 40, wherein a center of the mask is positioned approximately on the rotational axis.

42. The exposure apparatus according to claim 39, wherein the mark includes a plurality of sub-marks formed on the mask, and the detecting system includes a plurality of detecting optical systems for detecting the respective sub-marks.

43. The exposure apparatus according to claim 39, further comprising a reduction projection optical system which is arranged between the mask state and the substrate and projects the pattern formed on the mask onto the substrate while reducing a size of the pattern.

44. The exposure apparatus according to claim 39, wherein the mask has a circular shape.

45. A projection exposure apparatus which has a mask stage and exposes a substrate with a pattern formed on a circular mask placed on the mask stage comprising:

a reduction projection optical system which is provided between the mask stage and the substrate and projects an image of the pattern on the circular mask onto the substrate while reducing a size of the image.

a prealignment device which is provided near the mask stage and prealignes the circular mask, the prealignment device detecting a plurality of marks formed on the circular mask to determine orientation information of the circular mask based on the detection result of the marks, and prealigning the circular mask based on the orientation information, and a transporter which is provided between the mask stage and the prealignment device and transports the circular mask to the mask stage while maintaining an orientation of the prealigned circular mask.

46. The projection exposure apparatus according to claim 45, wherein the prealignment device rotates the circular mask.

47. The projection exposure apparatus according to claim 45, wherein the prealignment device includes a prealignment stage which is rotatable when the circular mask is placed on the prealignment stage.

* * * * *

UNITED STATES PATENT AND TRADEMARK OFFICE
CERTIFICATE OF CORRECTION

PATENT NO.    : 6,727,978 B2
DATED         : April 27, 2004
INVENTOR(S)   : Kenji Nishi It is certified that error appears in the above-identified patent and that said Letters Patent is hereby corrected as shown below:

Column 15,
Line 34, change "mark" to -- marks --.

Column 16,
Line 16, change "projector" to -- projection --;
Line 24, change "dimensionally, and" to -- dimensionally; and a transporter for transporting the circular mask to the mask stage while --.

Column 17,
Line 26, change "determining" to -- determine --;
Line 29, change "an" to -- and --.

Column 18,
Line 64, change "process" to -- projects --.

Column 20,
Line 16, before "detection result", change "the" to -- a --.

Signed and Sealed this

Thirtieth Day of November, 2004

JON W. DUDAS
*Director of the United States Patent and Trademark Office*